US006954389B2

United States Patent
Nakamura (10) Patent No.: US 6,954,389 B2
(45) Date of Patent: Oct. 11, 2005

(54) DYNAMIC SEMICONDUCTOR STORAGE DEVICE AND METHOD OF READING AND WRITING OPERATIONS THEREOF

(75) Inventor: Yutaka Nakamura, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,207

(22) Filed: Jun. 25, 2004

(65) Prior Publication Data

US 2005/0024965 A1 Feb. 3, 2005

(30) Foreign Application Priority Data

Jul. 30, 2003 (JP) ........................................ 2003-282271

(51) Int. Cl.[7] ................................................ G11C 7/00
(52) U.S. Cl. ......................... 365/205; 365/203; 365/207
(58) Field of Search .......................... 365/205, 63, 203, 365/207, 230.03

(56) References Cited

U.S. PATENT DOCUMENTS 5,566,116 A * 10/1996 Kang .......................... 365/205
5,646,900 A * 7/1997 Tsukude et al. ............. 365/205
5,701,268 A * 12/1997 Lee et al. .................... 365/205
6,466,502 B1 * 10/2002 Matsumoto .................. 365/208

FOREIGN PATENT DOCUMENTS

| JP | 2001-84767 | 1/1989 |
| JP | H4-370596 | 12/1992 |
| JP | 2002-298577 | 10/2002 |

* cited by examiner

Primary Examiner—Son T. Dinh
(74) Attorney, Agent, or Firm—Robert A. Walsh (57) ABSTRACT

To provide a dynamic semiconductor storage device featuring reduced power consumption and faster operation of a sense amplifier. The drain of a transistor N7 constituting an N-type sense amplifier NSAt is connected to a shared line SA, while the drain of a transistor N8 is connected to a shared line /SA. The drain of a transistor N9 constituting an N-type sense amplifier NSAb is connected to a shared line SA, while the drain of a transistor N10 is connected to a shared line /SA. The threshold voltages of transistors N7 to N10 range from 0.2V to 0.3V, which are lower than a threshold voltage of transistors P1 to P3. A supply voltage Vdd is applied to the gates of isolators BLIt and BLIb to clamp the supply voltage Vdd by the isolators BLIt and BLIb so as to set the internal voltage of an array to 0.8V, which is lower than the supply voltage Vdd by the threshold voltage of transistors N3 to N6.

8 Claims, 6 Drawing Sheets

DYNAMIC SEMICONDUCTOR STORAGE DEVICE AND METHOD OF READING AND WRITING OPERATIONS THEREOF

BACKGROUND OF INVENTION

The present invention relates to a dynamic semiconductor storage device and a method of reading and writing operations thereof, and more particularly to a dynamic random access memory (DRAM) and a method of reading and writing operations thereof.

Hitherto, portable devices or the like, which are required to feature low power consumption, have been using SRAM (Static Random Access Memory). However, the SRAMs are being increasingly replaced by DRAMs featuring lower bit unit cost in response to the demand for larger capacities with the trend toward higher performance and more versatility of portable devices.

Meanwhile, it is necessary for DRAMs to perform refreshing operations at predetermined intervals to retain data even in a standby mode. The power consumed for the refreshing operations amounts to about 80 percent to about 90 percent of total power consumed in the standby mode, and it is therefore required to be considerably reduced.

A typical DRAM adopts a common sense amplifier system, in which a single sense amplifier is shared by a pair of bit lines so as to reduce a layout area. Furthermore, the DRAM adopts a half-Vdd precharging method in which the pair of bit lines is precharged to a voltage Vdd/2, which is a half of a supply voltage Vdd, so as to reduce power consumption.

Japanese Unexamined Patent Application Publication No. 2001-84767 discloses a DRAM equipped with a sense amplifier that permits fast amplification and fast rewrite without adversely affecting advantages of the half-Vdd precharging method.

Figure 4:
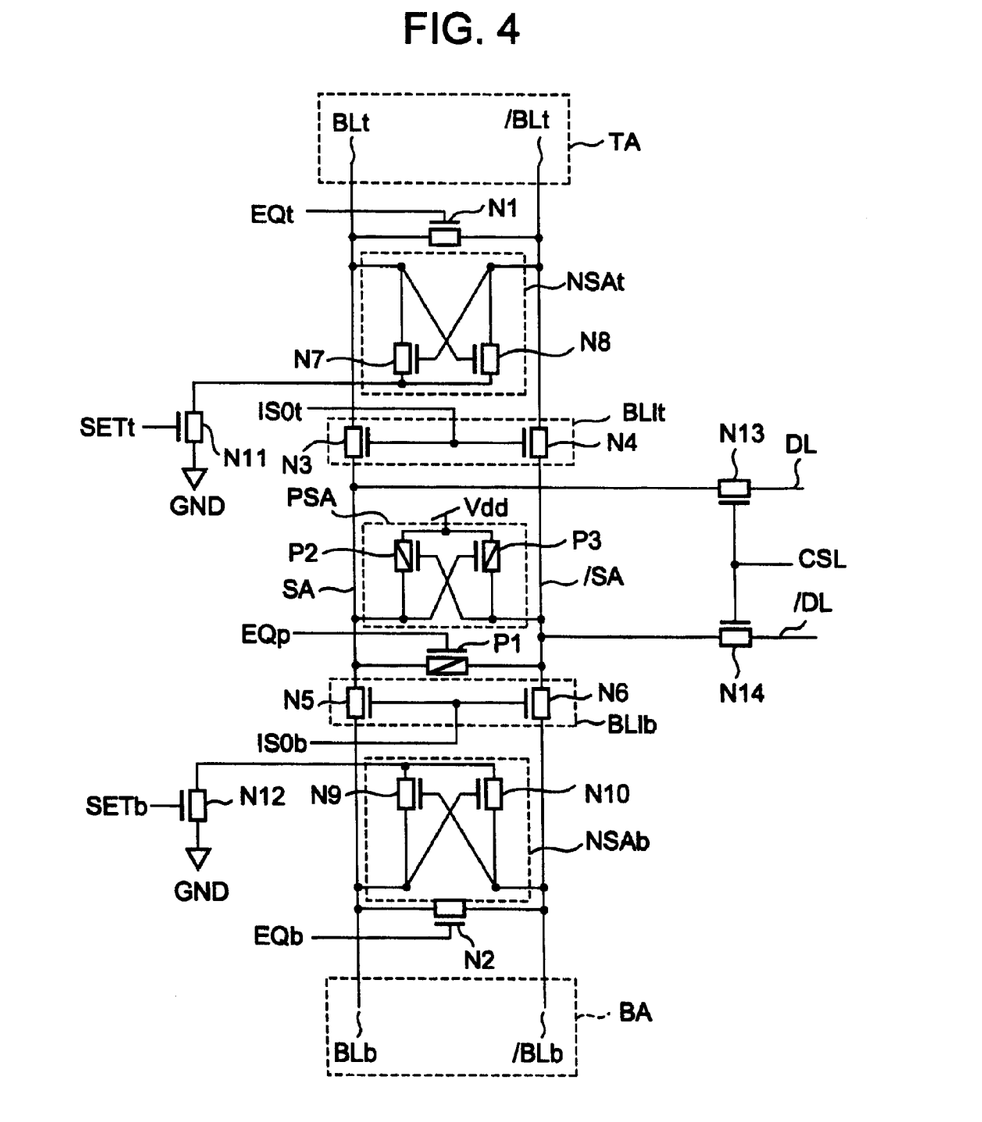
FIG. 4 is a circuit diagram showing an essential section of a conventional DRAM.

Referring to FIG. 4, the DRAM is provided with a top array TA, a bottom array BA, a P-type sense amplifier PSA, an N-type sense amplifiers NSAt and NSAb, an isolator BLIt that disconnect bit lines BLt and /BLt of the top array TA from shared lines SA and /SA, and an isolator BLIb that disconnect bit lines BLb and /BLb of the bottom array BA from shared lines SA and /SA.

The P-type sense amplifier PSA is connected between the shared lines SA and /SA. The sources of P-channel MOS transistors P2 and P3 constituting the P-type sense amplifier PSA are both connected to a Vdd power supply. The N-type sense amplifier NSAt is connected between the bit lines BLt and /BLt, and includes N-channel MOS transistors N7 and N8. The N-type sense amplifier NSAb is connected between the bit lines BLb and /BLb, and includes N-channel MOS transistors N9 and N10.

Figure 5:
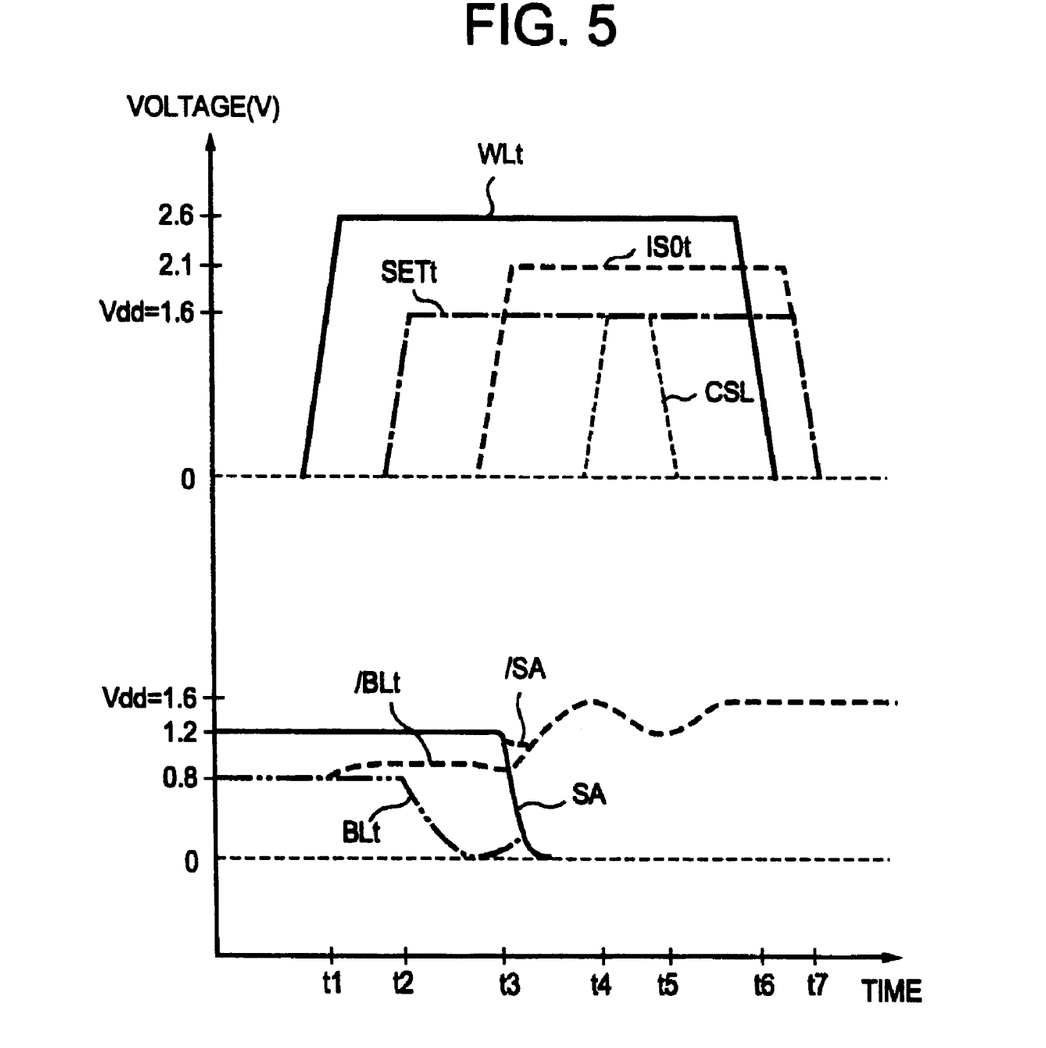
FIG. 5 is a timing chart illustrating the reading operation of the DRAM shown in FIG. 4.

The reading operation of the DRAM will now be explained with reference to the timing chart shown in FIG. 5.

The bit lines BLt and /BLt are equalized by an equalizing transistor (N-channel MOS transistor) N1 and precharged to Vdd/2 (0.8V in this example) before time t1. The shared lines SA and /SA are equalized by an equalizing transistor (P-channel MOS transistor) P1 and precharged to a predetermined voltage (1.2V in this example).

When a voltage WLt of a word line increases to a step-up voltage (2.6V in this example) at time t1, a potential difference is developed between the bit lines BLt and /BLt.

When a set signal SETt goes to "H" (logical high) level (Vdd=1.6V in this example) at time t2, a drive transistor (N-channel MOS transistor) N11 turns on. This actuates the N-type sense amplifier NSAt, and the voltage of the bit lines BLt or /BLt, whichever is lower (the voltage of the bit line BLt in this example), is pulled down to a ground potential (GND=0V in this example).

When an isolation control signal ISOt rises at time t3, the isolator BLIt turns on. The gate voltages of the N-channel MOS transistors N3 and N4 are boosted to be higher than the supply voltage Vdd by their threshold voltages (2.1V in this example). Hence, the voltages of the bit line BLt and the shared line SA will be the same, and the bit line /BLt and the shared line /SA will be also the same. As a result, a potential difference occurs also between the shared lines SA and /SA.

The P-type sense amplifier PSA constantly remains actuated, so that as soon as the potential difference takes place between the shared lines SA and /SA, the voltage of the shared line SA or /SA, whichever is higher (the voltage of the shared line /SA in this example), is pulled up to the supply voltage Vdd (1.6V in this example).

When a column selection signal CSL goes to the "H" level at time t4, column selection gates (N-channel MOS transistors) N13 and N14 turn on, and data signals on the shared lines SA and /SA are read onto data lines DL and /DL.

The column selection signal CSL returns to "L" (logical low) level at time t5. The voltage WLt of the word line returns to the ground potential at time t6. The set signal SETt returns to the "L" level and the isolation control signal ISOt returns to the ground potential at time t7.

As described above, the DRAM uses a "two-stage sensing method" in which the N-type sense amplifier NSAt starts its operation at time t2, and the P-type sense amplifier PSA starts its operation at time t3. The DRAM, therefore, requires long time for the reading operation.

When the data signals are read from the shared lines SA and /SA into the data lines DL and /DL, the P-type sense amplifier PSA must drive the data lines DL and /DL with heavy load, causing the voltages of the shared line /SA and the bit line /BLt to temporarily drop. To rewrite (or restore) the data signal destructively read out from a memory cell, the voltage WLt of the word line must be dropped after the voltages of the shared line /SA and the bit line /BLt are reset to the supply voltage Vdd. For this reason, the interval between time t5 and time t6 is set to be longer.

Figure 6:
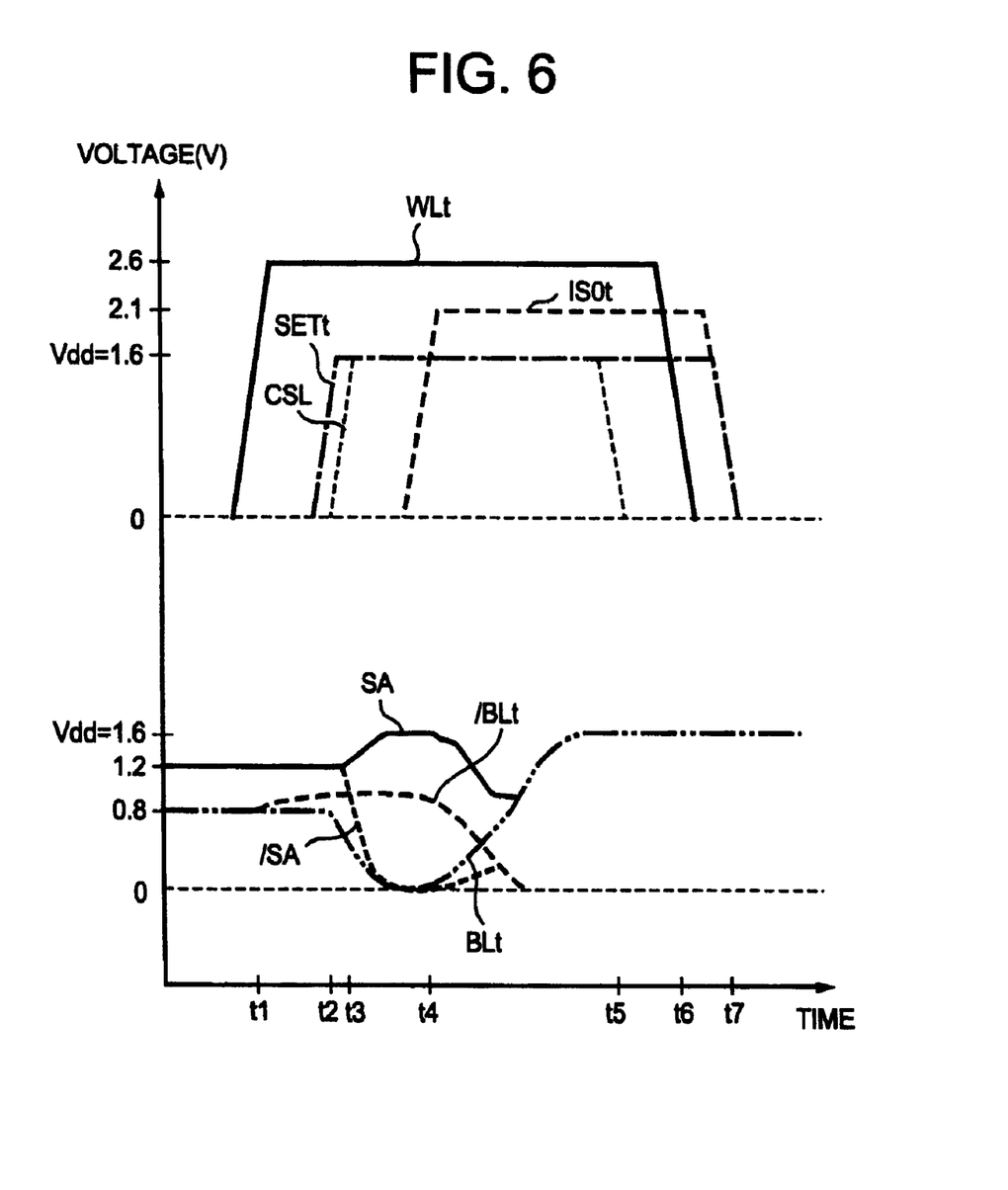
FIG. 6 is a timing chart illustrating the writing operation of the DRAM shown in FIG. 4.

The writing operation of the DRAM will now be explained with reference to the timing chart shown in FIG. 6.

The operation before time t2 is the same as that of the aforesaid reading operation. In this example, the N-type sense amplifier NSAt pulls the voltage of the bit line BLt down to the ground potential.

When the column selection signal CSL goes to the "H" level at time t3, the column selection gates N13 and N14 turn on, and the data signals on the data lines DL and /DL are transferred onto the shared lines SA and /SA. In this example, the shared line SA has the supply voltage Vdd, while the shared line /SA has the ground potential. At this point, the isolator BLIt is still off, so that the voltages of the bit lines BLt and /BLt are not equal to the voltages of the shared lines SA and /SA.

When the isolation control signal ISOt rises at time t4, the isolator BLIt turns on. The voltages of the bit lines BLt and /BLt and the shared lines SA and /SA will be the same. In this example, the bit line BLt has the supply voltage Vdd, while the bit line /BLt has the ground potential.

The operation after time t5 is the same as that of the reading operation described above.

In a write mode, the writing operation described above is performed on the selected pair of bit lines; however, the writing operation is not necessarily performed on an adjacent pair of bit lines thereof. On such an adjacent pair of bit lines, a reading operation is performed to restore data signals destructively read from the memory cell. The data signals widely swing on the pair of bit lines on which the writing operation is performed, so that the data signals may be reversed due to the influences of coupling noises in the pair of bit lines on which the reading operation is carried out. In order to reduce the influences, therefore, the isolator BLIt must be turned on after the N-type sense amplifier NSAt sufficiently amplifies the data signals read onto the bit lines. Hence, the interval between time t2 and time t4 is longer.

To write reverse data signals from the read data signals, the data signals sufficiently amplified by the N-type sense amplifier NSAt must be reversed. Thus, the interval between time t4 and time t5 is longer.

Meanwhile, Japanese Unexamined Patent Application Publication No. 2002-298577 discloses a DRAM that has achieved markedly reduced refresh current by reducing all voltages, including a supply voltage. In the DRAM, the number of memory cells connected to a bit line is cut down by half so as to cut down the capacity of the bit line by half in order to secure a sufficient reading potential difference.

In the DRAM shown in FIG. 4, however, the threshold voltages of the transistors P2 and P3 of the P-type sense amplifier PSA are approximately 0.6V, so that the supply voltage Vdd can be reduced only down to approximately 1.0V.

Accordingly, a method is conceivable, in which the supply voltage Vdd remains unchanged, namely, 1.6V, while the gate voltages of the isolators BLIt and BLIb are set to the supply voltage Vdd (1.6V) rather than 2.1V, and the voltage of one of the bit lines, whichever is higher, is clamped. This method makes it possible to significantly reduce power consumption in an array by reducing the internal voltage of the array to approximately 0.8V. However, in the half-Vdd precharging method, the precharge voltage of the bit lines will be approximately 0.4V (=0.8V÷2), so that the gate-drain voltages of transistors N7 to N10 will be low. This leads to significantly slow operations of the N-type sense amplifiers NSAt and NSAb.

SUMMARY OF INVENTION

An object of the present invention is to provide a dynamic semiconductor storage device featuring reduced power consumption and a method of reading and writing operations thereof.

Another object of the present invention is to provide a dynamic semiconductor storage device featuring faster operations of sense amplifiers and a method of reading and writing operations thereof.

A dynamic semiconductor storage device in accordance with the present invention is provided with a first shared line, a second shared line paired with the first shared line, a first bit line, a second bit line paired with the first bit line, a third bit line, a fourth bit line paired with the third bit line, a first isolator connected between the first and second shared lines and the first and second bit lines, a second isolator connected between the first and second shared lines and the third and fourth bit lines, a P-type sense amplifier connected between the first and second shared lines, and first and second N-type sense amplifiers. The first N-type sense amplifier includes a first N-type field effect transistor having a gate connected to the first bit line and a drain connected to the second shared line, and a second N-type field effect transistor having a gate connected to the second bit line and a drain connected to the first shared line. The second N-type sense amplifier includes a third N-type field effect transistor having a gate connected to the third bit line and a drain connected to the second shared line, and a fourth N-type field effect transistor having a gate connected to the fourth bit line and a drain connected to the first shared line.

In the dynamic semiconductor storage device, the drain and gate of the first N-type field effect transistor are connected to the second shared line and the first shared line, respectively, and the drain and gate of the second N-type field effect transistor are connected to the first shared line and the second shared line, respectively. Thereby, unless the first isolator is turned on, the first N-type sense amplifier still detects a potential difference having occurred between the first and second bit lines and causes a potential difference between the first and second shared lines. Thereafter, the first N-type sense amplifier and the P-type sense amplifier amplify the potential difference between the first and second shared lines. The second N-type sense amplifier operates initiator the same manner. It results in high-speed operations of the sense amplifiers.

Preferably, the P-type sense amplifier includes a first P-type field effect transistor having its gate connected to the first shared line and its drain connected to the second shared line and a second P-type field effect transistor having its gate connected to the second shared line and its drain connected to the first shared line. The first to fourth N-type field effect transistors have threshold voltages lower than those of the first and second P-type field effect transistors.

In this case, even if gate voltages of the isolator are used as supply voltages and an internal voltage of an array is decreased by clamping a higher voltage of the bit lines, causing the gate-drain voltages of the N-type sense amplifiers to decrease, the N-type sense amplifiers can still detect a potential difference between the bit lines.

Preferably, sources of the first and second P-type field effect transistors are directly connected to a power supply.

In this case, immediately after the N-type sense amplifiers cause a potential difference to appear between the first and second shared lines, the P-type sense amplifier starts amplification.

A method of reading operation of the dynamic semiconductor storage device according to the present invention includes a step for increasing a voltage of a word line, a step for actuating the first or second N-type sense amplifier after increasing the voltage of the word line, a step for applying a supply voltage to a gate of the first or second isolator after actuating the first or second N-type sense amplifier, and a step for turning on a column selection gate after applying the supply voltage to the gate of the first or second isolator.

A method of writing operation in accordance with the present invention includes a step for increasing a voltage of a word line, a step for actuating the first or second N-type sense amplifier after increasing the voltage of the word line, a step for turning on a column selection gate after increasing the voltage of the word line, and a step for applying the supply voltage to a gate of the first or second isolator after actuating the first or second N-type sense amplifier and turning on the column selection gate.

In the methods of the reading and writing operations, the supply voltage is applied to the gates of the isolators, so that the voltage of one of the bit lines, whichever is higher, is clamped to reduce the internal voltage of an array. This allows consumed power to be reduced.

Preferably, the methods of the reading and writing operations include a step for precharging the first to fourth bit lines to a voltage that is lower than half the supply voltage before increasing the voltage of the word line.

With this arrangement, power consumption of the array can be reduced.

BRIEF DESCRIPTION OF DRAWINGS

An embodiment according to the present invention will be explained in detail with reference to the accompanying drawings. In the drawings, like or equivalent components will be assigned like reference numerals.

DETAILED DESCRIPTION

Figure 1:
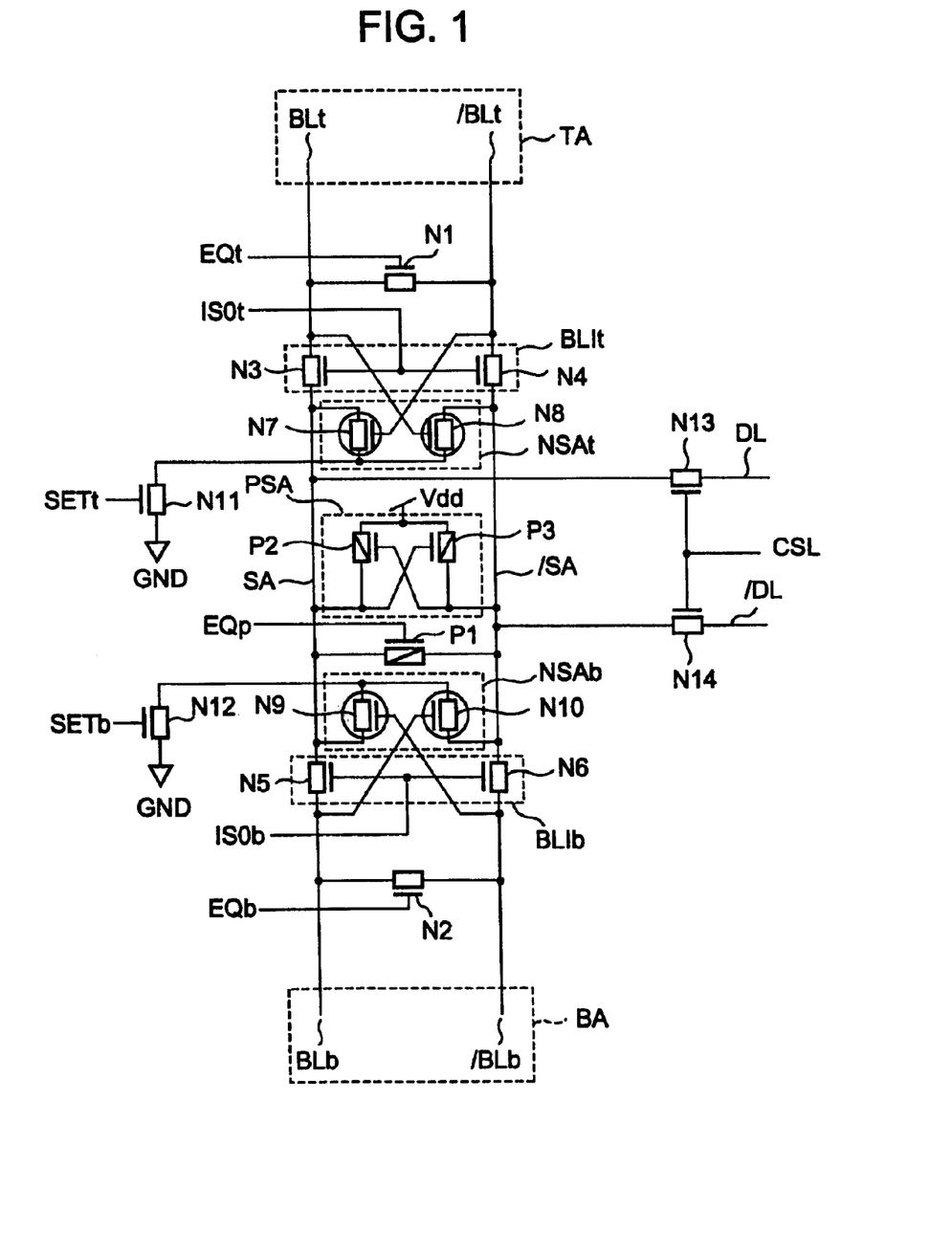
FIG. 1 is a circuit diagram showing an essential section of a DRAM according to an embodiment of the present invention.

Referring to FIG. 1, a DRAM according to the present embodiment has a top array TA and a bottom array BA, isolators BLIt and BLIb, a P-type sense amplifier PSA, and N-type sense amplifiers NSAt and NSAb.

Each of the top array TA and the bottom array BA includes a plurality of memory cells (not shown) arranged in a matrix pattern, a plurality of word lines (not shown) arranged in rows, and a plurality of pairs of bit lines arranged in columns. FIG. 1 shows bit lines BLt and /BLt constituting one pair of bit lines in the top array TA and bit lines BLb and /BLb constituting one pair of bit lines in the bottom array BA, as representative bit lines.

An equalizing transistor (N-channel MOS transistor) N1 that turns on or off in response to an equalizing signal EQt is connected between the bit lines BLt and /BLt. An equalizing transistor (N-channel MOS transistor) N2 that turns on or off in response to an equalizing signal EQb is connected between the bit lines BLb and /BLb.

The bit lines BLt and /BLt are connected to shared lines SA and /SA, respectively, through the isolator BLIt. The isolator BLIt includes N-channel MOS transistors N3 and N4 that turn on or off in response to an isolation control signal ISOt. The bit lines BLb and /BLb are connected to the shared lines SA and /SA, respectively, through the isolator BLIb. The isolator BLIb includes N-channel MOS transistors N5 and N6 that turn on or off in response to an isolation control signal ISOb.

An equalizing transistor (P-channel MOS transistor) P1 that turns on or off in response to an equalizing signal EQp is connected between the shared lines SA and /SA. Furthermore, a P-type sense amplifier PSA is connected between the shared lines SA and /SA.

The P-type sense amplifier PSA includes P-channel MOS transistors P2 and P3. The gate of the transistor P2 is connected to the shared line /SA, and the drain thereof is connected to the shared line SA. The gate of the transistor P3 is connected to the shared line SA, and the drain thereof is connected to the shared line /SA. The sources of the transistors P2 and P3 are interconnected and connected to a Vdd power supply.

The N-type sense amplifier NSAt includes the N-channel MOS transistors N7 and N8. The gate of the transistor N7 is connected to the bit line /BLt, and the drain thereof is connected to the shared line SA. The gate of the transistor N8 is connected to the bit line BLt, and the drain thereof is connected to the shared line /SA. The sources of the transistors N7 and N8 are interconnected.

The N-type sense amplifier NSAb includes the N-channel MOS transistors N9 and N10. The gate of the transistor N9 is connected to the bit line /BLt, and the drain thereof is connected to the shared line SA. The gate of the transistor N10 is connected to the bit line BLt, and the drain thereof is connected to the shared line /SA. The sources of the transistors N9 and N10 are interconnected.

The DRAM is further equipped with a driving transistor (N-channel MOS transistor) N11 for four N-type sense amplifiers NSAt, and a driving transistor (N-channel MOS transistor) N12 for four N-type sense amplifiers NSAb. A driving transistor N11 connected between the sources of the transistors N7 and N8 and ground GND turns on or off in response to a set signal SETt. A driving transistor N12 connected between the sources of the transistors N9 and N10 and ground GND turns on or off in response to a set signal SETb.

The DRAM further includes column selection gates (N-channel MOS transistors) N13 and N14 that turn on or off in response to the column selection signal CSL. The column selection gate N13 is connected between the shared line SA and a data line DL. The column selection gate N14 is connected between the shared line /SA and a data line /DL.

Unlike the conventional DRAM shown in FIG. 4, in the DRAM according to the present embodiment, the drain of the transistor N7 constituting the N-type sense amplifier NSAt is connected to the shared lines SA, and the drain of the transistor N8 is connected to the shared lines /SA. Similarly, the drain of the transistor N9 constituting the N-type sense amplifier NSAb is connected to the shared lines SA, and the drain of the transistor N10 is connected to the shared lines /SA. The threshold voltages of the transistors N7 to N10 range from 0.2V to 0.3V, which are lower than the threshold voltages of other transistors P1 to P3, N1 to N6, and N11 to N14 (typically 0.5V to 0.6V).

The supply voltage Vdd is 1.6V. As will be discussed hereinafter, the supply voltage Vdd is applied to the gates of the isolators BLIt and BLIb, so that the supply voltage Vdd is clamped by the isolators BLIt and BLIb. Hence, the internal voltages of the arrays are lower (0.8V in this example) than the supply voltage Vdd by the threshold voltages of the transistors N3 to N6.

Figure 2:
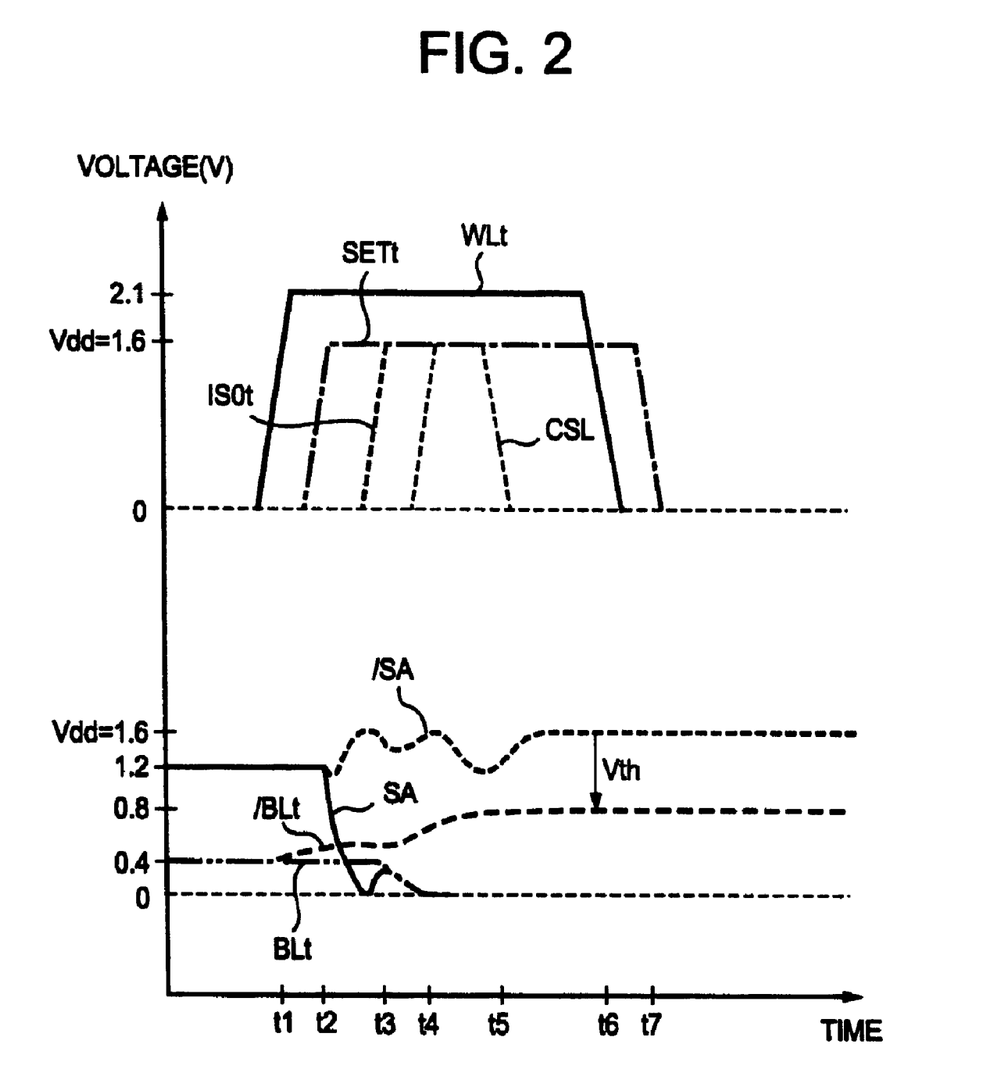
FIG. 2 is a timing chart illustrating the reading operation of the DRAM shown in FIG. 1.

Reading Operation:

The reading operation of the DRAM will now be explained with reference to a timing chart shown in FIG. 2.

By time t1, the bit lines BLt and /BLt will have been equalized by the equalizing transistor N1 and precharged to a voltage (0.4V in this example) that is half the internal voltage of arrays. The shared lines SA and /SA are equalized by the equalizing transistor P1 and precharged to a voltage (1.2V in this example) that is higher than the precharge voltage of the bit lines BLt and /BLt.

When a voltage WLt of the word lines increases to a boost voltage (2.1V in this example) at time t1, a potential difference occurs between the bit line BLt and the bit line /BLt. In the present embodiment, the drains of the transistors N7 and N8 are connected to the shared lines SA and /SA rather than the bit lines BLt and /BLt, so that the parasitic capacitance of the bit lines BLt and /BLt can be reduced by the drain capacitance of the transistors N7 and N8. This results in an increased potential difference occurring between the bit lines BLt and /BLt, thus making it possible to shorten the interval between time t1 and the following time t2.

When the set signal SETt goes to the "H" level (Vdd= 1.6V in this example) at time t2, the driving transistor N11 turns on, actuating the N-type sense amplifier NSAt. The gates of the transistors N7 and N8 constituting the N-type sense amplifier NSAt are connected to the bit lines /BLt and BLt, respectively, so that the N-type sense amplifier NSAt detects a potential difference between the bit lines BLt and /BLt.

However, the drains of the transistors N7 and N8 are not connected to the bit lines /BLt and BLt, and the isolator BLIt is still off at this point. Therefore, the N-type sense amplifier NSAt does not pull down the voltages of the bit lines BLt and /BLt.

Meanwhile, the drains of the transistors N7 and N8 are connected to the shared lines SA and /SA, respectively, so that the N-type sense amplifier NSAt pulls down the voltage of the shared line (SA in this example) that is associated with whichever bit line having a lower voltage (the bit lines BLt in this example) of the bit lines BLt and /BLt to the ground potential. As a result, a potential difference takes place also between the shared lines SA and /SA. Furthermore, the drain voltages of the transistors N7 and N8 are 1.2V, which is higher than 0.4V, at time t2, so that the sensitivity of the N-type sense amplifier NSAt is high.

In addition, the sources of the transistors P2 and P3 are directly connected to a Vdd power supply, so that the moment the N-type sense amplifier NSAt begins the operation and a potential difference occurs between the shared lines SA and /SA, the P-type sense amplifier PSA begins its operation to pull up the voltage of the shared line SA or /SA, whichever is higher (the voltage of the shared line /SA in this example), to the supply voltage Vdd (1.6V in this example).

In other words, at this point, the P-type sense amplifier PSA and the N-type sense amplifier NSAt fully amplify the potential difference between the shared lines SA and /SA, while they do not amplify the potential difference between the bit lines BLt and /BLt at all. The parasitic capacitance of the shared lines SA and /SA is considerably smaller than the parasitic capacitance of the bit lines BLt and /BLt, so that the potential difference between the shared lines SA and /SA is fully amplified quickly. Thus, the interval between time t2 and time t3 can be shortened.

At this point, the potential difference between the bit lines is not amplified at all; therefore, even if set signal timings are slightly shifted between adjacent pairs of bit lines, a coupling noise produced between the adjacent pairs of bit lines is cut down to about a quarter. This level of coupling noise can be ignored, allowing the N-type sense amplifier NSAt to amplify even a slight potential difference.

When the isolation control signal ISOt goes to the "H" level at time t3, the isolator BLIt turns on. At this time, the gate voltages of the transistors N3 and N4 have not yet increased and are still the supply voltage Vdd. Hence, the voltage of the bit line BLt or /BLt, whichever is lower (the bit line BLt in this example), goes down to the same ground potential as that of the shared line SA, but the voltage of the bit line having a higher voltage (the bit line /BLt in this example) does not increase to the same supply voltage Vdd as that of the shared line /SA. More specifically, the voltage of the bit line /BLt is clamped by the transistor N4 and rises only up to Vdd-Vth (Vth indicating the threshold voltage of the transistor N4).

When the column selection signal CSL goes to the "H" level at time t4, the column selection gates N13 and N14 turn on and data signals on the shared lines SA and /SA are read out onto the data lines DL and /DL. The data signals on the shared lines SA and /SA are at the supply voltage Vdd level, so that data signals of the supply voltage Vdd level appear on the data lines DL and /DL.

At time t5, the column selection signal CSL returns to the L level. At time t6, the voltage WLt of the word lines returns to the ground potential. At time t7, the set signal SETt and the isolation control signal ISOt both return to the "L" level.

When data signals are read out from the shared lines SA and /SA onto the data lines DL and /DL at time t4, the P-type sense amplifier PSA must drive the data line /DL having heavy load, so that the voltage of the shared line /SA drops. However, the P-type sense amplifier PSA resets the voltage of the shared line /SA to the supply voltage Vdd when the column selection gates N13 and N14 turn off at time t5.

In the conventional DRAM, to restore data signals destructively read from memory cells, the voltage WLt of the word lines is lowered after the voltages of the shared line /SA and the bit line /BLt return to the supply voltage Vdd. In the present embodiment, however, the voltage of the bit line /BLt is clamped by the transistor N4 and therefore does not lower, while the voltage of the shared line /SA drops. In other words, the array interval voltage is maintained at 0.8V and the voltage of the bit line /BLt is maintained at 0.8V, so that the voltage WLt of the word lines may be dropped without waiting for the voltage of the shared lines /SA to return to the supply voltage Vdd. Thus, the interval between time t5 and time t6 can be shortened.

Figure 3:
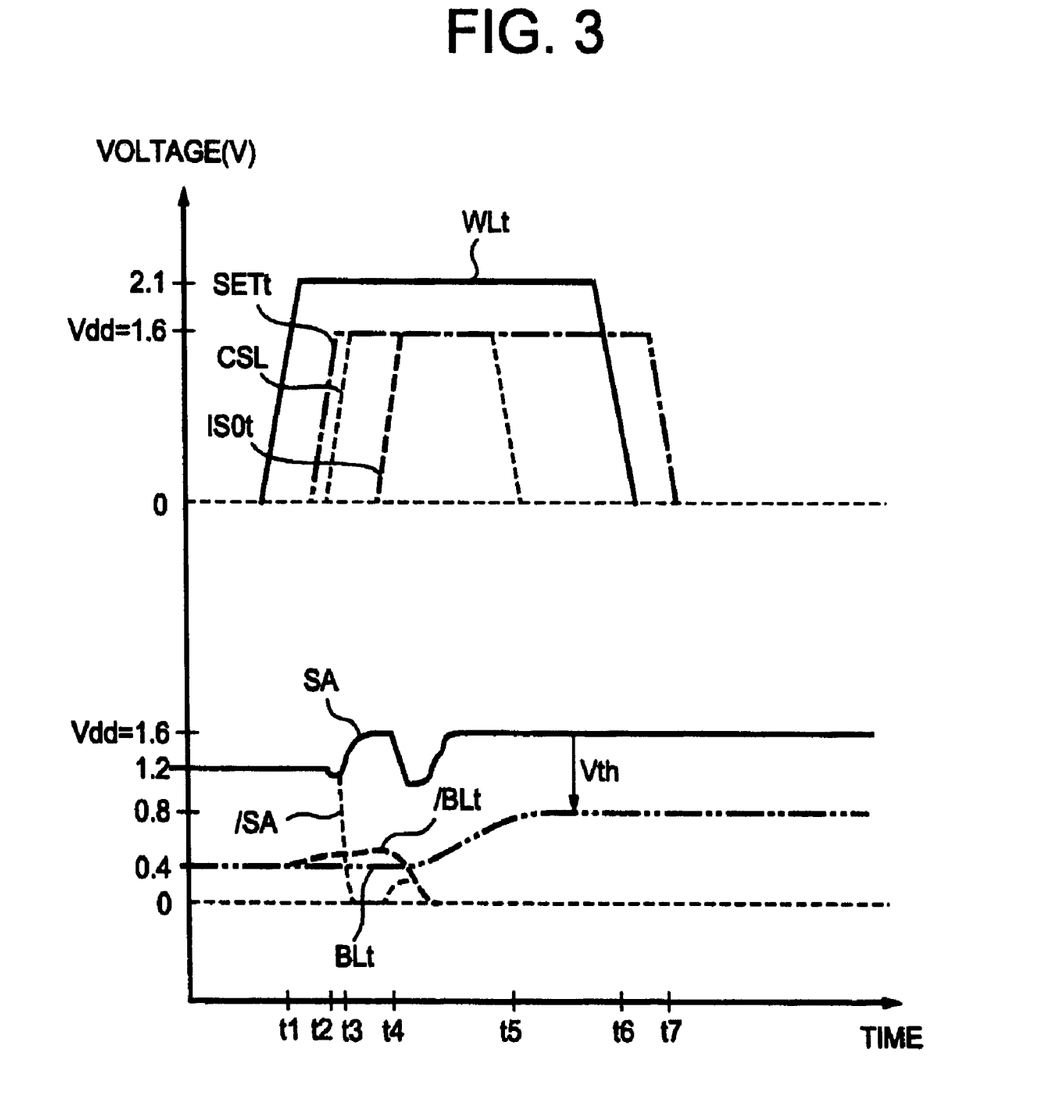
FIG. 3 is a timing chart illustrating the writing operation of the DRAM shown in FIG. 1.

Writing Operation:

The writing operation of the DRAM will now be explained with reference to the timing chart shown in FIG. 3.

The operation before time t2 is identical to that of the aforesaid reading operation.

The set signal SETt goes to the "H" level at time t2, and the column selection signal CSL goes to the "H" level at time t3. In this example, following the set signal SETt, the column selection signal CSL goes to the "H" level; however, this order may be reversed. Alternatively, the set signal SETt and the column selection signal CSL may simultaneously go to the "H" level.

When the column selection signal CSL goes to the "H" level at time t3, the column selection gates N13 and N14 turn on, and data signals on the date lines DL and /DL will be transferred onto the shared lines SA and /SA.

In this example, the shared line SA has the supply voltage Vdd, while the shared line /SA has the ground potential. At this point, the isolator BLIt is still off. Furthermore, although the set signal SETt is "H" level, the drains of the transistors N7 and N8 are not connected to the bit lines /BLt and BLt, so that the N-type sense amplifier NSAt does not pull down the voltage of the bit line BLt or /BLt. Hence, the potential difference occurring between the bit lines BLt and /BLt is maintained as it is.

When the isolation control signal ISOt goes to the "H" level at time t4, the isolator BLIt turns on, and the voltages of the bit lines BLt and /BLt change in response to data signals on the shared lines SA and /SA.

In this example, since the voltage of the shared line /SA is the ground potential, the voltage is transmitted as it is through the intermediary of the transistor N4, and the voltage of the bit line /BLt becomes the ground potential. Meanwhile, the voltage of the shared line SA is the supply voltage Vdd, so that the voltage is clamped by the transistor N3 and transmitted to the bit line /BLt. Hence, the voltage of the bit line BLt increases toward Vdd-Vth (Vth being the threshold voltage of the transistor N4). At this time, the voltage of the shared line SA temporarily lowers, but it does not excessively lowers since it is clamped by the transistor N3.

In the conventional DRAM, to protect an adjacent pair of bit lines on which no writing operation is performed from coupling noises from a pair of bit lines on which the writing operation is performed, it is required that the N-type sense amplifier NSAt fully amplify a data signal read onto the pair of bit lines, and then the isolator BLIt be turned on. In the present embodiment, a data signal read onto a pair of bit lines is not amplified, allowing the interval between time t2 and time t4 to be shortened.

In this example, although a reverse data signal from the read data signal is written to the bit lines BLt and /BLt, the N-type sense amplifier NSAt does not pull down the voltage of the bit line /BLt, thus allowing the data signal read onto the bit lines BLt and /BLt to be easily reversed. As a result, the interval between time t4 and time t5 can be shortened.

The operation after time t5 is identical to that of the aforesaid reading operation.

As described above, according to the present embodiment, there is no need for boosting the isolation control signals ISOt and ISOb, and the supply voltage Vdd can be used as it is. This makes it possible to obviate the need for a step-up circuit or a regulator, which consumes DC currents in a standby mode.

Moreover, the voltage of the bit line of a pair of bit lines, whichever is higher, is clamped by the isolators BLIt and BLIb, making it possible to lower the step-up voltages WLt and WLb of the word lines so as to reduce power consumption.

The present embodiment has the same number of devices constituting the circuit as that of the conventional circuit, merely requiring the connection of the drains of the transistors N7 to N10 be changed from the bit lines BLt, /BLt, BLb and /BLb to the shared lines SA and /SA. Therefore, the layout area will hardly increase.

Furthermore, a detecting operation begins in response to a small read signal by a direct sensing method, and the read signal is amplified on the shared lines SA and /SA with small parasitic capacitances. This arrangement permits faster detection and amplification to be achieved.

Since data signals are read from and written to data lines with heavy load, the voltages of the shared lines SA and /SA temporarily drop while the column selection gates N13 and N14 are on; however, pairs of bit lines are not subjected to the aforesaid influences, because they are clamped by the isolators BLIt and BLIb. This permits a faster restoring operation.

Thus, by markedly reducing refresh current, the power consumption in the standby mode can be reduced to a level of an SRAM, the operation of the sense amplifiers can be speeded up, and the time required for reading and writing can be shortened.

The embodiment in accordance with the present invention has been explained above; however, the aforesaid embodiment is just an example for embodying the present invention. Therefore, the present invention is not limited to the embodiment described above, but may be implemented by modifying, as necessary, the aforesaid embodiment within the spirit and scope thereof.

The dynamic semiconductor storage device in accordance with the present invention can be used for, for example, a DRAM of a portable device.

A person understanding this invention may now conceive of alternative structures and embodiments or variations of the above. All of those which fall within the scope of the claims appended hereto are considered part of the present invention.

What is claimed is:

1. A dynamic semiconductor storage device, comprising:
   a first shared line;
   a second shared line paired with said first shared line;
   a first bit line;
   a second bit line paired with said first bit line;
   a third bit line;
   a fourth bit line paired with said third bit line;
   a first isolator connected between said first and second shared lines and said first and second bit lines;
   a second isolator connected between said first and second shared lines and said third and fourth bit lines;
   a first sense amplifier connected between said first and second shared lines; and
   second and third sense amplifiers;
   wherein said second sense amplifier includes:
   a first field effect transistor having a gate connected to said first bit line and a drain connected to said second shared line; and
   a second field effect transistor having a gate connected to said second bit line and a drain connected to said first shared line; and
   wherein said third sense amplifier includes:
   a third field effect transistor having a gate connected to said third bit line and a drain connected to said second shared line; and
   a fourth field effect transistor having a gate connected to said fourth bit line and a drain connected to said first shared line.

2. The dynamic semiconductor storage device according to claim 1, wherein the first sense amplifier is a P-type and the second and third sense amplifiers are N-type and the first, second and third field effect transistors are N-type.

3. The dynamic semiconductor storage device according to claim 2 wherein said first sense amplifier includes:
   a first field effect transistor having a gate connected to said first shared line and a drain connected to said second shared line; and
   a second field effect transistor having a gate connected to said second shared line and a drain connected to said first shared line; and
   wherein said first to fourth field effect transistors have threshold voltages that are smaller than the threshold voltages of said first and second field effect transistors.

4. The dynamic semiconductor storage device according to claim 3, wherein
   sources of said first and second field effect transistors are directly connected to a power supply.

5. A method of reading operation of the dynamic semiconductor storage device according to claim 4, comprising the steps of:
   increasing a voltage of a word line;
   actuating said second or third sense amplifier after increasing the voltage of said word line;
   applying a supply voltage to a gate of said first or second isolator after actuating said first or second sense amplifier; and turning on a column selection gate after applying the supply voltage to the gate of said first or second isolator.

6. The method of reading operation of the dynamic semiconductor storage device according to claim 5, further comprising a step for precharging said first to fourth bit lines to a voltage that is lower than a half of the supply voltage before increasing the voltage of said word line.

7. A method of writing operation of the dynamic semiconductor storage device according to claim 1, comprising the steps of:

increasing a voltage of a word line;

actuating said first or second sense amplifier after increasing the voltage of said word line;

turning on a column selection gate after increasing the voltage of said word line; and applying the supply voltage to a gate of said first or second isolator after actuating said first or second N-type sense amplifier and turning on said column selection gate.

8. The method of writing to the dynamic semiconductor storage device according to claim 7, further comprising a step for precharging said first to fourth bit lines to a voltage that is lower than a half of the supply voltage before increasing the voltage of said word line.

* * * * *